(12) United States Patent
Ito et al.

(10) Patent No.: US 7,787,082 B2
(45) Date of Patent: Aug. 31, 2010

(54) PHOTOSENSOR AND DISPLAY DEVICE

(75) Inventors: Ryoichi Ito, Kanagawa (JP); Go Yamanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 109 days.

(21) Appl. No.: 12/263,851

(22) Filed: Nov. 3, 2008

(65) Prior Publication Data
US 2009/0141224 A1 Jun. 4, 2009

(30) Foreign Application Priority Data
Nov. 29, 2007 (JP) ............... 2007-308596

(51) Int. Cl.
*G02F 1/133* (2006.01)
*H01L 31/0232* (2006.01)
(52) U.S. Cl. ................ 349/116; 257/432; 257/E31.127
(58) Field of Classification Search .......... 257/431, 257/432, 433, 434, 444, E31.127, 461, 462, 257/463, 464, 466; 385/88, 89, 92, 93, 94, 385/14; 349/116
See application file for complete search history.

(56) References Cited

U.S. PATENT DOCUMENTS

| 6,888,989 | B1 * | 5/2005 | Zhou et al. ............... 385/50 |
| 7,173,311 | B2 * | 2/2007 | Sato et al. ............... 257/355 |
| 7,298,955 | B2 * | 11/2007 | Kooriyama ............... 385/146 |
| 2003/0222334 | A1 * | 12/2003 | Ikeda et al. ............... 257/678 |
| 2006/0220073 | A1 * | 10/2006 | Kooriyama ............... 257/257 |
| 2009/0141224 | A1 * | 6/2009 | Ito et al. ............... 349/116 |

FOREIGN PATENT DOCUMENTS

JP 2004-119494 4/2004

* cited by examiner

*Primary Examiner*—Brian M Healy
(74) *Attorney, Agent, or Firm*—K&L Gates LLP

(57) ABSTRACT

A photosensor including a semiconductor thin film having a light receiving portion includes the following elements. A substrate has a recess with an inclined side wall having a forward tapered shape. A reflective material layer is disposed along the recess of the substrate. An insulating layer covers the substrate having thereon the reflective material layer. The semiconductor thin film is disposed on the insulating layer so as to cross the recess. The light receiving portion of the semiconductor thin film is disposed above the recess.

11 Claims, 13 Drawing Sheets

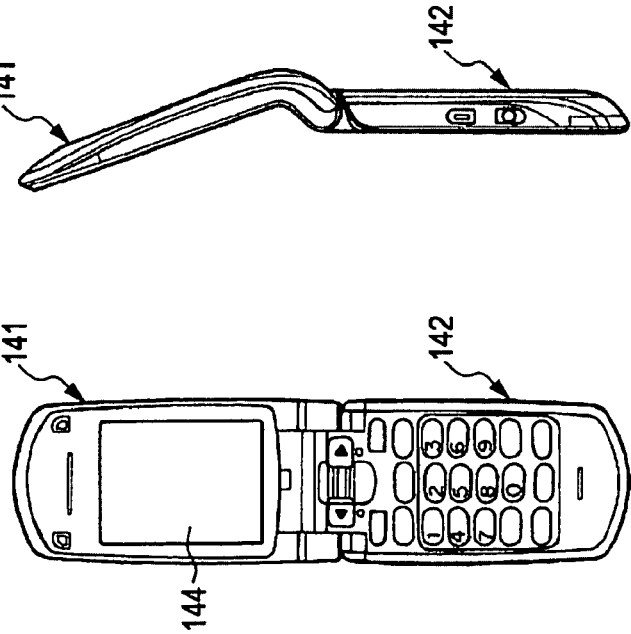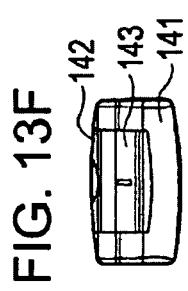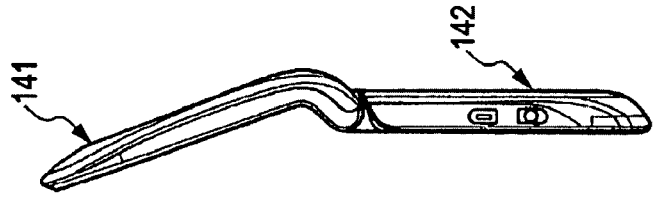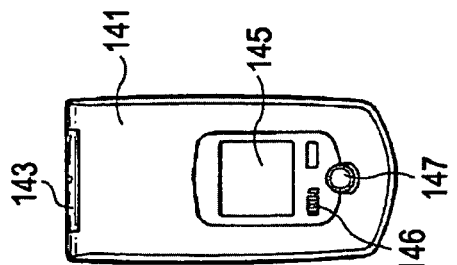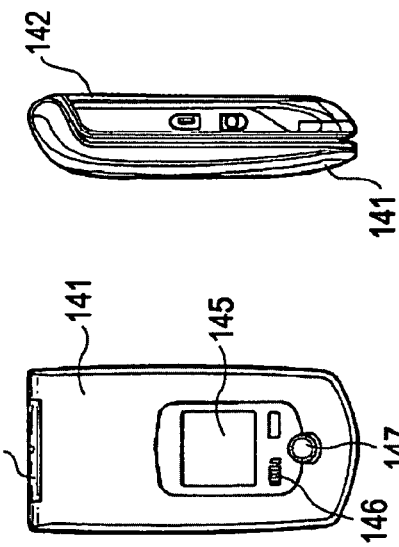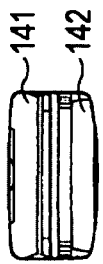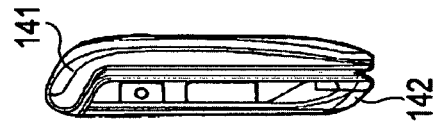

PHOTOSENSOR AND DISPLAY DEVICE

CROSS REFERENCES TO RELATED APPLICATIONS

The present application claims priority to Japanese Patent Application JP 2007-308596 filed in the Japanese Patent Office on Nov. 29, 2007, the entire contents of which is incorporated herein by reference.

BACKGROUND

Some of liquid crystal display devices, used as display units of mobile phones and personal digital assistants (PDAs), each include a photosensor as a position information input unit.

FIG. 14 illustrates the structure of a PIN diode arranged as a photosensor in such a display device. Referring to FIG. 14, the PIN diode includes a substrate 201, an insulating layer 202 covering the substrate 201, and a semiconductor thin film 203, including a polycrystalline silicon (hereinafter, polysilicon) film, on the insulating layer 202. The semiconductor thin film 203 has a p-doped region (p region) 203p, a lightly p-doped region (i-doped region or i region) 203i, and an n-doped region (n region) 203n in that order. The semiconductor thin film 203 is overlaid with an insulating layer 204. The insulating layer 204 has a contact hole 204a which reaches the p region 203p and another contact hole 204a which reaches the n region 203n. Extraction electrodes 205 are connected to the p region 203p and the n region 203n via the contact holes 204a, respectively. In the photosensor with the above-described structure, the i region 203i serves as a light receiving portion. Pairs of holes and electrons generated by photoelectric conversion in the light receiving portion are extracted from the p region 203p and the n region 203n.

Such a photosensor is formed in the same step as that of forming a thin film transistor for liquid crystal driving control using a low-temperature polysilicon technique whereby an amorphous silicon film is polycrystallized by laser irradiation to form a polysilicon film. According to the low-temperature polysilicon technique, however, it is difficult to obtain a polysilicon film having a thickness of 80 nm or more. Only part of light coming from above the substrate 201, which is transparent, is absorbed by the polysilicon film formed in the above-described manner, the part being determined by the light absorption spectrum of silicon. Particularly, long-wavelength light ranging from red light to infrared light is hardly absorbed by the polysilicon layer and passes therethrough. Accordingly, it is difficult for the photosensor including such a polysilicon film to obtain an optical signal having a large magnitude.

To solve that problem, the structure in which the surface of the junction (PN junction surface) between the i region 203i and the n region 203n in the semiconductor thin film 203 is inclined relative to the surface of the semiconductor thin film 203 is proposed. In this structure, the increased area of the PN junction allows the semiconductor thin film 203 to more easily absorb light. For example, Japanese Unexamined Patent Application Publication No. 2004-119494 discloses such a structure.

In the structure disclosed in Japanese Unexamined Patent Application Publication No. 2004-119494, however, there is little expectation of significant improvement of the light absorption efficiency at long wavelengths. Furthermore, in this structure, it is difficult to form a photosensor itself. In addition, the angle of inclination of the PN junction surface varies in the range from 10° to 45°, leading to large variations in device characteristics.

Furthermore, when a photosensor with the above-described structure is arranged in a liquid crystal display device with a backlight, a light receiving portion (the i region 203i) of the semiconductor thin film 203 noticeably absorbs noise light coming from the backlight. Accordingly, the ratio of signal component S to noise component N, i.e., the S/N ratio is reduced. Disadvantageously, the sensitivity is not obtained in the application of sensing light coming from above the display device.

Accordingly, it is desirable to provide a photosensor capable of improving the sensitivity to light coming from above a substrate while having uniform device characteristics and a display device including the photosensor.

SUMMARY

The present disclosure relates to photosensors and display devices, and in particular, to a photosensor, such as a PIN diode, including a semiconductor thin film, and a display device including the photosensor.

According to an embodiment, there is provided a photosensor including a semiconductor thin film having a light receiving portion. The photosensor includes a substrate having a recess with an inclined side wall having a forward tapered shape, a reflective material layer disposed along the recess of the substrate, an insulating layer covering the substrate having thereon the reflective material layer, and the semiconductor thin film disposed on the insulating layer so as to cross the recess. The light receiving portion of the semiconductor thin film is disposed above the recess.

According to another embodiment, a display device includes a substrate, a pixel portion, and the above-described photosensor such that the pixel portion and the photosensor are disposed on one surface of the substrate.

In the photosensor with the above-described structure, light components, as part of light coming from above the substrate, are not absorbed by the semiconductor thin film and pass therethrough. The light components are reflected by the reflective material layer, so that the light components again enter the semiconductor thin film. Accordingly, this results in an increase in the amount of light, coming from above the substrate, absorbed by the semiconductor thin film. The light components, reflected by the reflective material layer covering the inclined side wall of the recess arranged in the substrate, are converged toward the center of the recess. Consequently, the light components reflected by the reflective material layer can be converged on the light receiving portion disposed above the recess. Thus, the amount of light absorbed in the light receiving portion can be increased. In addition, the light components, reflected by the reflective material layer covering the inclined side wall of the recess, laterally and obliquely enter the semiconductor thin film including the light receiving portion (i-doped region). Accordingly, the optical path length in the light receiving portion (i-doped region) is increased. Consequently, long-wavelength light is also absorbed by the semiconductor thin film, thus improving the sensitivity to long-wavelength light, e.g., infrared light.

As described above, according to the present application, the amount of absorbed light that comes from above the substrate on which the photosensor is disposed can be increased and light coming from below the substrate can be prevented from entering the i-doped region of the semiconductor thin film. Consequently, the sensitivity to light coming from above the substrate can be increased. In addition, the sensitivity to long-wavelength light can also be increased.

Additional features and advantages are described herein, and will be apparent from the following Detailed Description and the figures.

BRIEF DESCRIPTION OF THE FIGURES

FIGS. 13A to 13G are diagrams illustrating a portable terminal, such as a mobile phone, according to another application, FIG. 13A being a front view of the mobile phone in an unfolded state, FIG. 13B being a side view thereof, FIG. 13C being a front view thereof in a folded state, FIG. 13D being a left side view thereof, FIG. 13E being a right side view thereof, FIG. 13F being a top view thereof, FIG. 13G being a bottom view thereof.

DETAILED DESCRIPTION

Embodiments will be described in detail below with reference to the drawings.

First Embodiment

Figure 1A:
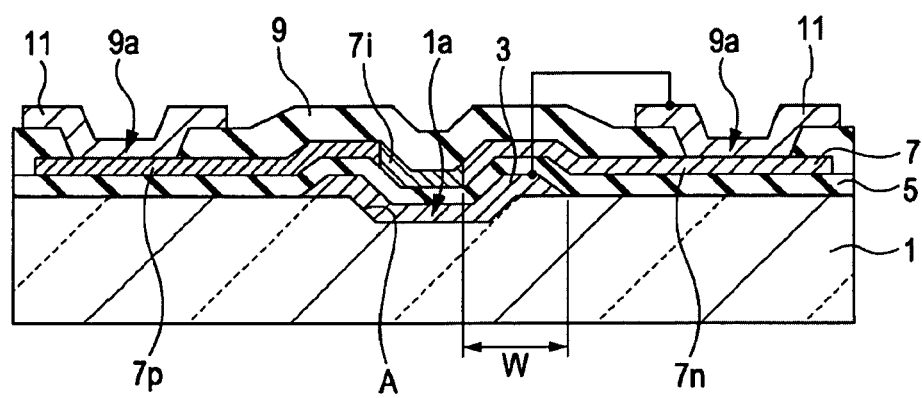
FIGS. 1A and 1B are diagrams explaining the structure of a photosensor according to an embodiment.
Figure 1B:
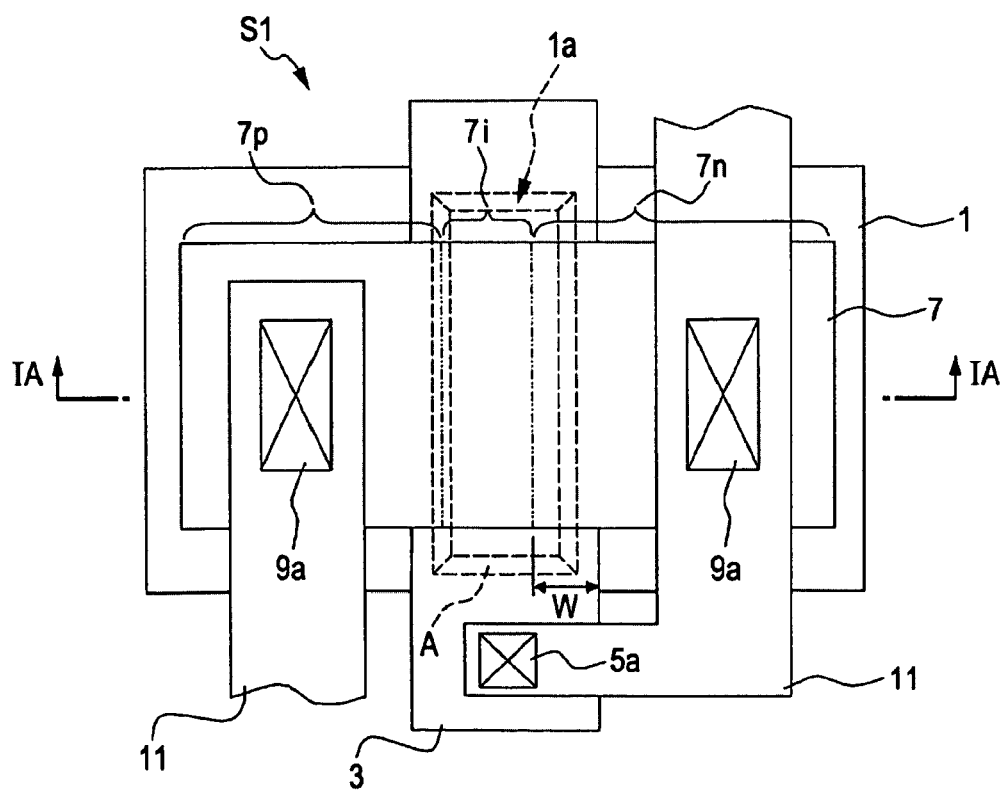

FIG. 1A is a schematic cross-sectional view of substantial part of a photosensor S1 according to a first embodiment, the photosensor S1 being a feature of a display device. FIG. 1B is a plan view of the photosensor S1. The cross section taken along the line IA-IA in FIG. 1B corresponds to that shown in FIG. 1A.

The photosensor S1 is a photosensor S having a so-called PIN thin film diode structure. The photosensor S1 has the following structure.

A substrate 1, made of a transparent material, has a recess 1$a$ on one surface. The recess 1$a$ has an inclined side wall A having such a forward tapered shape that the width of the recess is gradually increased toward the open end of the recess.

A reflective material layer 3, made of a light-reflective material, is patterned on the substrate 1 so as to cover the inner wall, including the bottom and the inclined side wall A, and the periphery of the recess 1$a$. It is important that the reflective material layer 3 has such a thickness as not to fill the recess 1$a$ and is formed along the inclined side wall A.

The substrate 1 having thereon the reflective material layer 3 is covered with an insulating layer 5. It is preferred that the insulating layer 5 be made of a light-transmissive material and have such a thickness as not to fill the recess 1$a$ and be formed along the inclined side wall A.

The insulating layer 5 is overlaid with a semiconductor thin film 7 such that the semiconductor thin film 7 crosses the recess 1$a$. It is preferred that the semiconductor thin film 7 be disposed across at least the recess 1$a$ and have such a thickness as not to fill the recess 1$a$ and be formed along the inclined side wall A.

In the semiconductor thin film 7, part disposed above the recess 1$a$ serves as a light receiving portion 7$i$ including a lightly doped region (i region). A p region 7$p$ doped with a p-type impurity is arranged on one side of the light receiving portion (i region) 7$i$ and an n region 7$n$ doped with an n-type impurity is arranged on the other side thereof, thereby constructing a PIN diode. Note that the light receiving portion (i region) 7$i$ is a $p^{31}$ region more lightly doped with the p-type impurity than the p region 7$p$.

In the semiconductor thin film 7, it is preferred that the light receiving portion (i region) 7$i$ be completely covered with the reflective material layer 3 and the light receiving portion (i region) 7$i$ be disposed above the bottom of the recess 1$a$ covered with the reflective material layer 3. In addition, preferably, a portion W where the n region 7$n$ overlaps the reflective material layer 3 has a sufficient width (hereinafter, also referred to as "overlap width W") so that the reflective material layer 3 completely covers the PN junction surface as the interface between the light receiving portion (i region) 7$i$, serving as a lightly p-doped layer, and the n region 7$n$. Consequently, the light receiving efficiency in the vicinity of the PN junction can be increased, a variation in sensitivity to light can be reduced, and light coming from below the substrate toward the vicinity of the PN junction can be blocked out.

In the above-described structure, the depth of the recess 1$a$ in the substrate 1, the angle of inclination of the inclined side wall A, and the thickness of the insulating layer 5 are designed so that light reflected by the reflective material layer 3 disposed along the inclined side wall A is collected to the light receiving portion (i region) 7$i$ of the semiconductor thin film 7.

The semiconductor thin film 7 is a film made of amorphous silicon, microcrystalline silicon, polysilicon, or the combination thereof. It is preferred that the semiconductor thin film 7 be made of polysilicon. More preferably, the semiconductor thin film 7 is made of polysilicon prepared such that the diameter of crystal grain is large in the direction parallel to the substrate 1. Accordingly, the light receiving portion (i region) 7$i$, is completely depleted by applying a relatively low voltage, so that the light absorption efficiency can be improved. The semiconductor thin film 7 is not limited to a layer containing silicon. The semiconductor thin film 7 may be a layer made of oxide semiconductor.

The semiconductor thin film 7 having the above-described structure is covered with an insulating interlayer 9 made of a light-transmissive material. On the insulating interlayer 9, interconnects connected to the p region 7$p$ and the n region 7$n$ via contact holes 9$a$, respectively, are arranged.

Although the reflective material layer 3 has conductivity because the layer is made of the light-reflective material, such as aluminum or high melting metal, the reflective material layer 3 is not used to drive the photosensor S1. It is unnecessary to design the reflective material layer 3 so that an independent voltage is applied to the layer. The reflective material layer 3 is connected to, for example, the n region 7n of the semiconductor thin film 7.

It is preferred that the above-described reflective material layer 3 be connected to the n region 7n via the interconnect 11. Accordingly, a contact hole 5a (see FIG. 1B) that reaches the reflective material layer 3 can be formed in the insulating interlayer 9 and the insulating layer 5 underlying the interlayer in the same step as that of forming the contact holes 9a that reach the p region 7p and the n region 7n, respectively, in the insulating interlayer 9, thus preventing an increase in the number of processing steps.

FIGS. 2A to 2E are diagrams showing a procedure for manufacturing the photosensor S1 according to the first embodiment. The procedure for manufacturing the photosensor S1 will now be described with reference to FIGS. 2A to 2E.

Figure 2A:
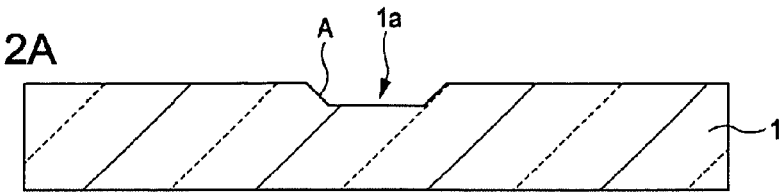
FIGS. 2A to 2E are cross-sectional views for explaining a procedure for manufacturing the photosensor according to the embodiment.

First, as shown in FIG. 2A, the recess 1a for light collection is selectively formed in each of portions to be photosensors (hereinafter, referred to as "photosensor portions" or "sensor portions") in the substrate 1 by, for example, dry etching. In this case, dry etching is performed so that the recess 1a has the inclined side wall A having a forward tapered shape.

Figure 2B:
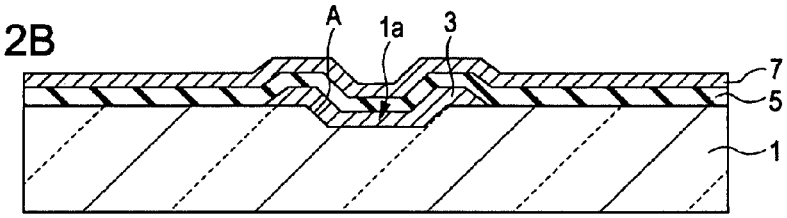

Subsequently, as shown in FIG. 2B, a metallic layer is formed on the substrate 1 having the recess 1a by sputtering. The metallic layer is patterned using a resist pattern (not shown) as a mask by dry etching, thereby forming the reflective material layer 3 such that the layer 3 covers the inclined side wall A and the bottom of the recess 1a. Preferably, the reflective material layer 3 is made of metal having excellent light reflectivity. The reflective material layer 3 may include, for example, silver (Ag), aluminum (Al), copper (Cu), gold (Au), platinum (Pt), nickel (Ni), or rhodium (Rh) as a base material. When heat treatment at or above 650° C. is performed during manufacture of the photosensor or a device (for example, a display device) including the photosensor, it is preferred that the reflective material layer 3 be made of high melting metal. For example, the reflective material layer 3 may include molybdenum (Mo), chromium (Cr), tungsten (W), or tantalum (Ta) as a base material.

Next, the insulating layer 5 composed of two sublayers, i.e., a silicon nitride ($SiN_x$) sublayer and a silicon oxide ($SiO_2$) sublayer is formed so as to cover the reflective material layer 3.

The insulating layer 5 is overlaid with the semiconductor thin film 7 made of amorphous silicon. Furthermore, the semiconductor thin film 7 is crystallized by, for example, excimer laser annealing (ELA), thus obtaining a polysilicon layer.

Figure 2C:
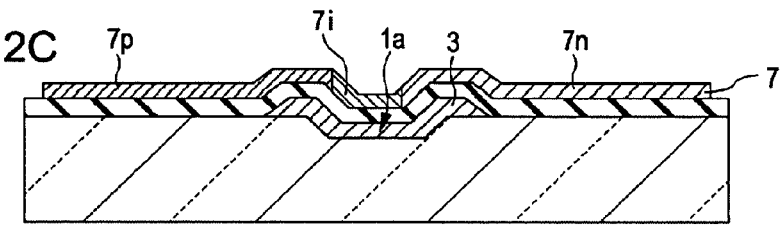

After that, as shown in FIG. 2C, impurities are introduced into the semiconductor thin film 7 by, for example, ion implantation to form the p region 7p doped with the p-type impurity, the light receiving portion (i region) 7i lightly doped with the p-type impurity, and the n region 7n doped with the n-type impurity. After the ion implantation, the regions are subjected to rapid thermal annealing (RTA) at, for example, about 600° C., thereby activating the implanted impurities. This step is performed simultaneously with formation of source/drain regions of a thin film transistor.

The positions of the p region 7p, the i region 7i, and the n region 7n relative to the recess 1a and the reflective material layer 3 are as described above. In other words, the i region 7i is arranged above the bottom of the recess 1a and the portion W where the n region 7n overlaps the reflective material layer 3 has the sufficient width such that the reflective material layer 3 completely covers the PN junction surface as the interface between the light receiving portion (i region) 7i and the n region 7n.

The semiconductor thin film 7 is patterned, thus separating the photosensor portions.

Figure 2D:
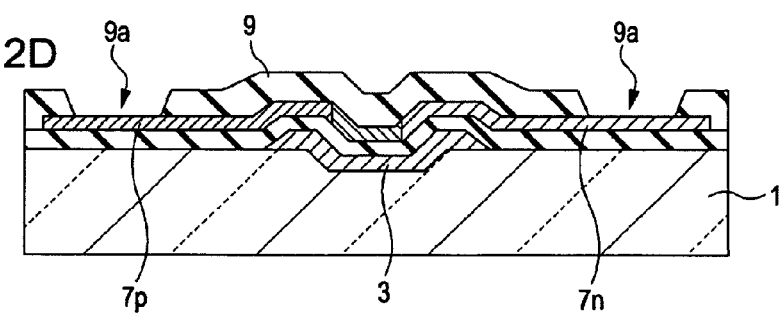

Subsequently, as shown in FIG. 2D, the insulating interlayer 9 composed of the two sublayers, i.e., the silicon nitride sublayer and the silicon oxide sublayer is formed on the whole surface of the substrate 1 so as to cover the layers on the surface thereof. After that, the contact hole 9a that reaches the p region 7p and the contact hole 9a that reaches the n region 7n are formed in the insulating interlayer 9. In this step, the contact hole 5a (not shown) which reaches the reflective material layer 3 is also formed in the insulating interlayer 9 and the insulating layer 5.

Figure 2E:
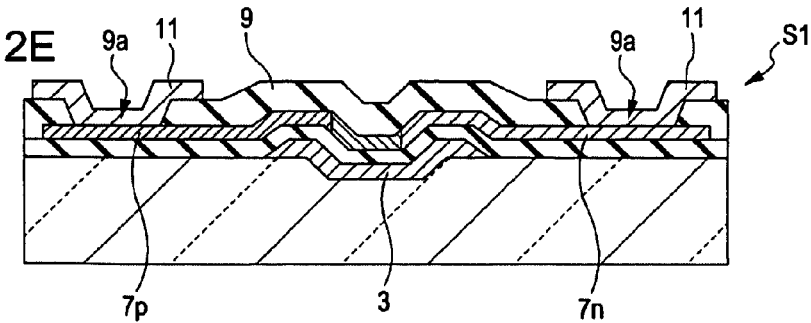

After that, as shown in FIG. 2E, the metallic layer is formed by sputtering and is then patterned using the resist pattern (not shown) as a mask by dry etching, thereby forming the interconnects 11 connected to the p region 7p and the n region 7n via the contact holes 9a, respectively. At that time, the interconnect 11 connected to the n region 7n is patterned so as to be connected to the reflective material layer 3 via the contact hole 5a (not shown).

The photosensor S1 with the structure described with reference to FIGS. 1A and 1B is obtained in this manner.

In the photosensor S1 with the above-described structure, light components, as part of light coming from above the substrate 1, are not absorbed by the light receiving portion (i region) 7i of the semiconductor thin film 7 and pass therethrough. The light components are reflected by the reflective material layer 3, so that the light components again enter the light receiving portion (i region) 7i of the semiconductor thin film 7. At that time, the light components reflected by the reflective material layer 3 covering the inclined side wall A of the recess 1a are reflected and converged toward the center of the recess 1a. Consequently, the light components reflected by the reflective material layer 3 can be converged on the light receiving portion (i region) 7i arranged above the bottom of the recess 1a. Thus, the amount of light, coming from above the substrate 1, absorbed in the light receiving portion (i region) 7i can be increased. In addition, since the reflective material layer 3 blocks out light, light coming from the rear of the substrate 1 can be prevented from entering the light receiving portion (i region) 7i of the semiconductor thin film 7.

The light components, reflected by the reflective material layer 3 covering the inclined side wall A of the recess 1a, laterally and obliquely enter the semiconductor thin film 7 including the light receiving portion (i region) 7i. Accordingly, the optical path length in the light receiving portion (i region) 7i is increased. Even when the semiconductor thin film 7 has a thickness of several tens of nanometers and is hard to absorb long-wavelength light, the increased optical path length in the light receiving portion (i region) 7i allows the long-wavelength light to be absorbed. Consequently, the amount of light absorbed can be further increased, thus improving the sensitivity.

Thus, the absorptance to light coming from above the substrate 1 of the light receiving portion (i region) 7i can be increased. In particular, the sensitivity to light coming from above the substrate 1 can be further improved. Since the sensitivity to long-wavelength light is improved, infrared light that is invisible can also be sensed.

Since the reflective material layer 3 is connected to the n region 7n, the reflective material layer 3 and the n region 7n are held at the same potential. This prevents the occurrence of parasitic capacitance in the portion W where the insulating layer 5 is sandwiched between the reflective material layer 3 and the n region 7n. Accordingly, signal charge derived from the i region 7i to the n region 7n can be prevented from being affected by the parasitic capacitance. Particularly, in the structure in which the PN junction surface, as the interface between the i region 7i and the n region 7n, is completely covered with the reflective material layer 3, the portion W where the n region 7n overlaps the reflective material layer 3 is increased. Accordingly, the efficiency of deriving signal charge can be remarkably improved by preventing the parasitic capacitance in the portion W.

As for the reflective material layer 3 designed so as not to receive an independent voltage, when the reflective material layer 3 is patterned, the layer is charged by electrostatic damage suffered on the layer in the formation step. The electrostatic damage is discharged from the reflective material layer 3 through the interconnect 11 connected to the n region 7n. Therefore, a depletion layer can be stably formed in the light receiving portion (i region) 7i disposed above the reflective material layer 3.

Accordingly, photoelectric conversion in the light receiving portion (i region) 7i can be efficiently performed and charge obtained by the photoelectric conversion can be efficiently derived, thus improving the sensitivity to received light. In addition, it is unnecessary to incline the PN junction surface relative to the surface of the substrate, thus preventing variations between devices.

In this embodiment, the light receiving portion (i region) 7i is the $p^{31}$ region more lightly p-doped than the p region 7p. The light receiving portion (i region) 7i may be an $n^{31}$ more lightly n-doped than the n region 7n.

Second Embodiment

Figure 3:
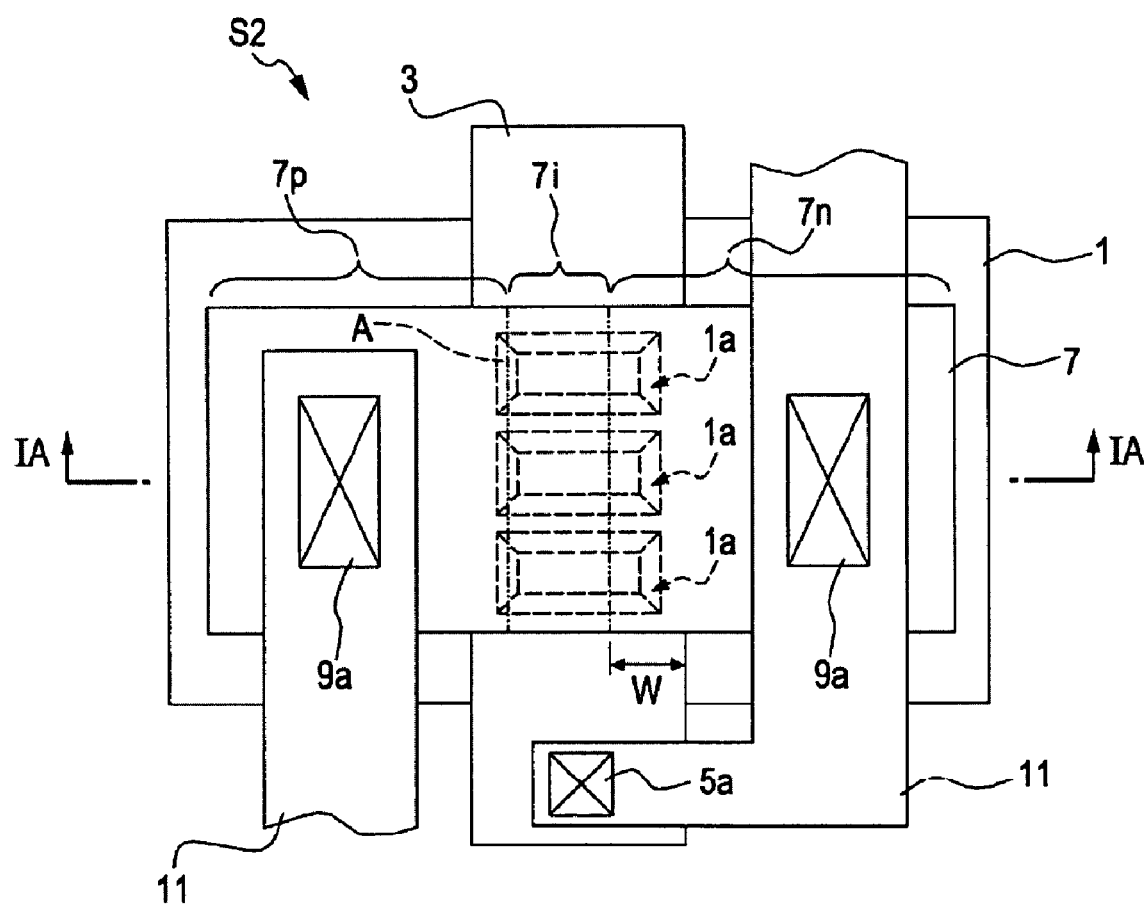
FIG. 3 is a diagram explaining the structure of a photosensor according to another embodiment n.

FIG. 3 is a plan view of a photosensor S2 according to a second modification, the photosensor S2 being a feature of a display device. The cross-section taken along the line IA-IA of FIG. 3 is the same as that shown in FIG. 1A.

The photosensor S2 differs from the photosensor S1 according to the first embodiment in that the photosensor S2 has a plurality of recesses 1a in the substrate 1. The other structure of the photosensor S2 is the same as that of the photosensor S1.

In this case, all of the recesses 1a are arranged below a portion where the light receiving portion (i region) 7i of the semiconductor thin film 7 is disposed. The shape of each recess 1a is the same as that in the first embodiment. In other words, each recess 1a has the inclined side wall A having such a forward tapered shape that the width of the recess is gradually increased toward the open end of the recess. The reflective material layer 3 is arranged so as to completely cover the inner wall, including the bottom and the inclined side wall A, of each recess 1a.

In addition, the light receiving portion (i region) 7i of the semiconductor thin film 7 is arranged in a plurality of recesses on the surface of the reflective material layer 3. In a manner similar to the first embodiment, it is preferred that the light receiving portion (i region) 7i be arranged in the bottom of each recess. In addition, the n region 7n overlaps the reflective material layer 3 with the sufficient overlap width W in a manner similar to the first embodiment.

So long as the light receiving portion (i region) 7i is arranged in the recesses, each having the inclined side wall A, in the surface of the reflective material layer 3, the recesses 1a may be aligned in one direction, as shown in FIG. 3, or randomly relative to the light receiving portion (i region) 7i.

The photosensor S2 with the above-described structure according to the second embodiment can be manufactured by the same procedure as that for the photosensor according to the first embodiment. The same advantages as those of the first embodiment can be obtained. In addition, the total area of the inclined side walls A is larger than that in the first embodiment. Accordingly, the light converging effect due to reflection by the reflective material layer 3 covering the inclined side walls A can be further enhanced. Since the sensitivity to long-wavelength light is increased, infrared light that is invisible can also be sensed.

Third Embodiment

Figure 4A:
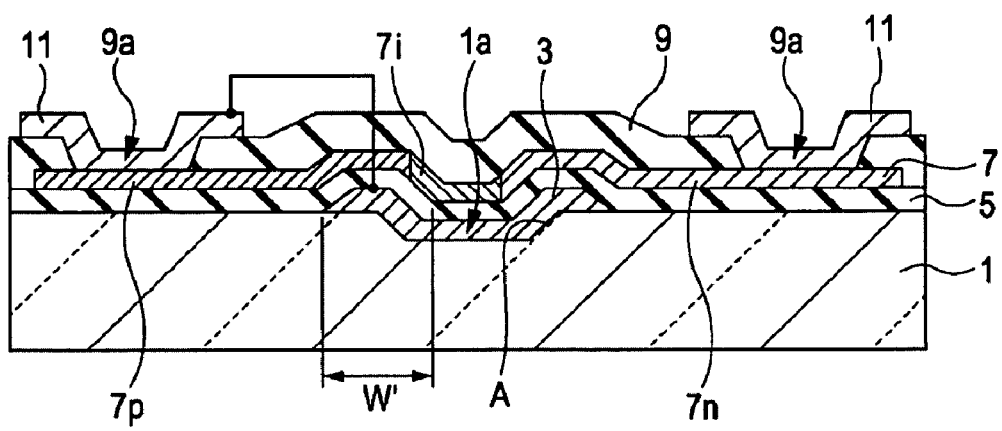
FIGS. 4A and 4B are diagrams explaining the structure of a photosensor according to another embodiment.
Figure 4B:
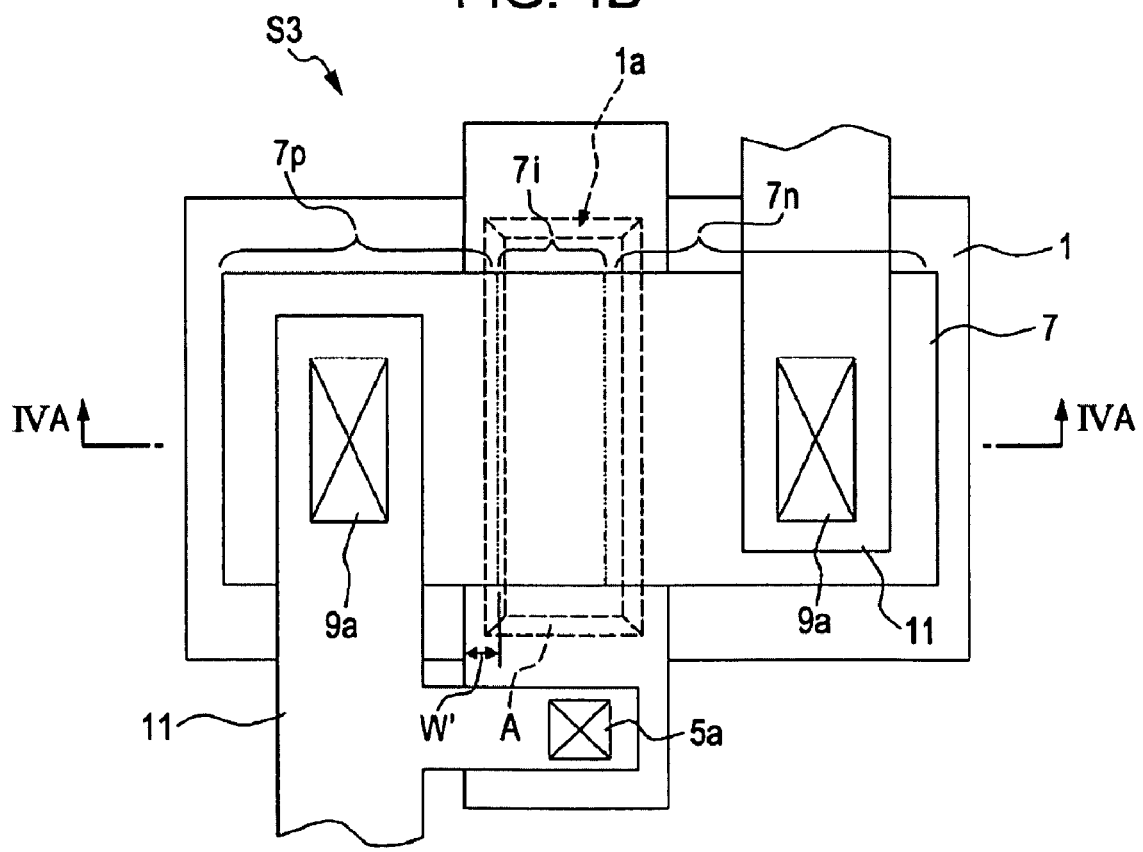

FIG. 4A is a schematic cross-sectional view of a photosensor S3 according to a third embodiment, the photosensor S3 being a feature of a display device. FIG. 4B is a plan view of the photosensor S3. The cross-section taken along the line IVA-IVA of FIG. 4B corresponds to that shown in FIG. 4A.

The photosensor S3 shown in FIGS. 4A and 4B differs from the photosensor S1 according to the first embodiment in that the reflective material layer 3 is connected to the p region 7p of the semiconductor thin film 7. The other structure, including the laminated relationship between the recess 1a, the reflective material layer 3, and the semiconductor thin film 7, of the photosensor S3 is the same as that of the photosensor S1.

In the photosensor S3 with the above-described structure, the reflective material layer 3 is arranged on the bottom and the inclined side wall A of the recess 1a of the substrate 1, so that the sensitivity to light, coming from the side of a display surface of the display device (i.e., from above the substrate 1) toward the photosensor S3, can be improved.

Since the reflective material layer 3 is connected to the p region 7p, the reflective material layer 3 and the p region 7p are held at the same potential. Accordingly, this prevents the occurrence of parasitic capacitance in a portion W' where the insulating layer 5 is sandwiched between the reflective material layer 3 and the p region 7p. Therefore, signal charge derived from the light receiving portion (i region) 7i to the p region 7p can be prevented from being affected by the parasitic capacitance. In addition, electrostatic damage suffered on the reflective material layer 3 in the formation step is discharged through the interconnect 11, so that a depletion layer can be stably formed in the light receiving portion (i region) 7i in the same way as the first embodiment.

Consequently, photoelectric conversion in the light receiving portion (i region) 7i can be efficiently performed and charge obtained by the photoelectric conversion can be efficiently derived. Thus, the sensitivity to received light can be improved. Since the sensitivity to long-wavelength light is improved, infrared light that is invisible can also be sensed.

The third embodiment may be combined with the second embodiment. In this case, a plurality of recesses 1a may be arranged under a portion where the reflective material layer 3 overlaps the semiconductor thin film 7.

In the above-described first to third embodiments, the reflective material layer 3 is connected to the n region 7n or the p region 7p. Even when the reflective material layer 3 is not connected to the n region 7n or the p region 7p, the following effects can be obtained: The first effect is obtained by reflecting light, coming from above the substrate 1, impinged on the semiconductor thin film 7 by the reflective material layer 3 disposed along the inclined side wall A of the recess (or the inclined side walls A of the recesses) 1a and allowing the reflected light to enter the light receiving portion (i region) 7i of the semiconductor thin film 7. The second effect of preventing light, directly coming from a backlight on the rear of the substrate 1, from entering the light receiving portion (i region) 7i of the semiconductor thin film 7 can be obtained by blocking out the light through the reflective material layer 3.

Fourth Embodiment

Figure 5A:
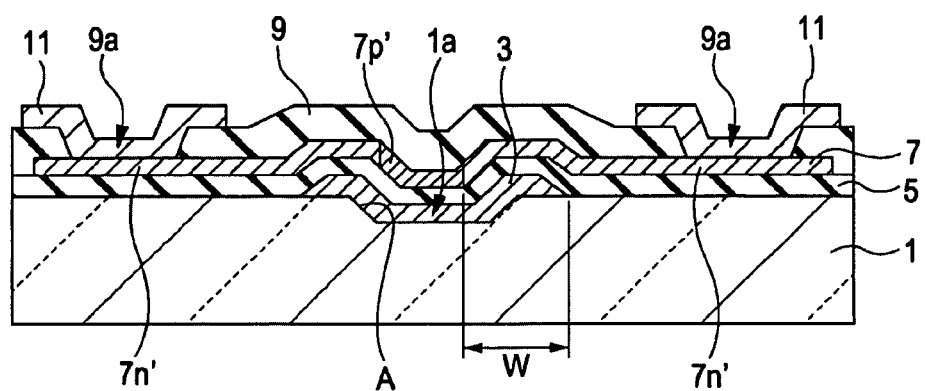
FIGS. 5A and 5B are diagrams explaining the structure of a photosensor according to another embodiment.
Figure 5B:
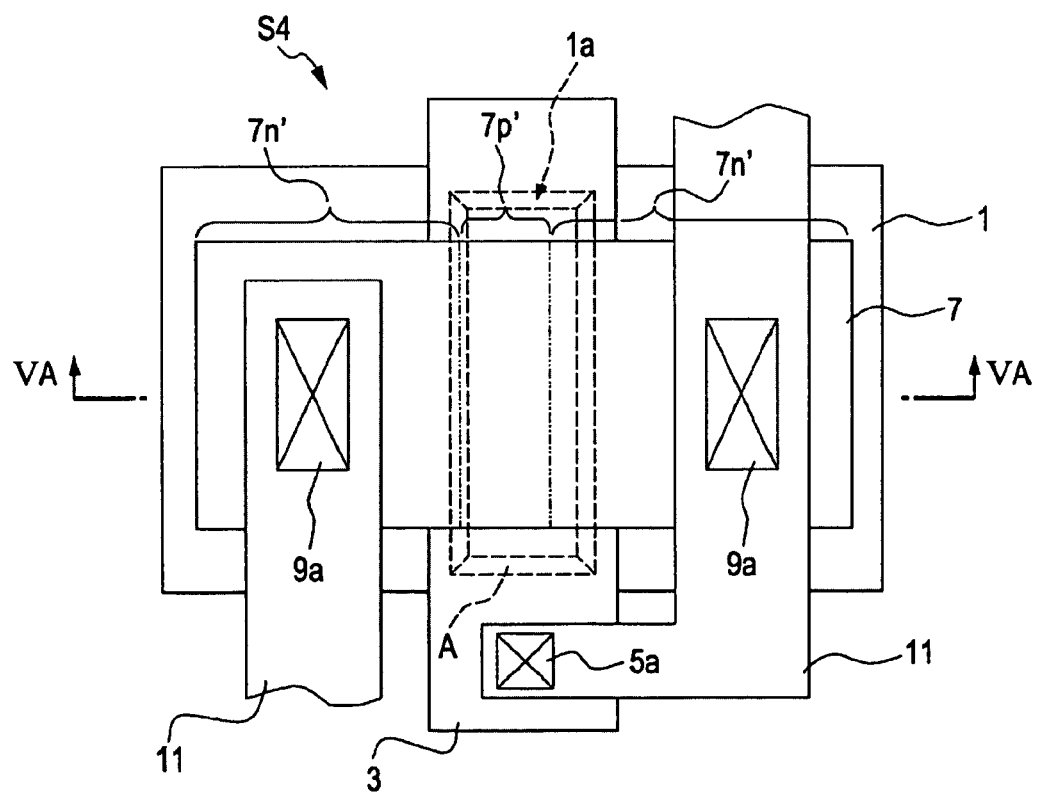

FIG. 5A is a schematic cross-sectional view of a photosensor S4 according to a fourth embodiment, the photosensor S4 being a feature of a display device. FIG. 5B is a plan view of the photosensor S4. The cross-section taken along the line VA-VA in the FIG. 5B corresponds to that shown in FIG. 5A.

The photosensor S4 shown in FIGS. 5A and 5B differs from the photosensor S1 according to the first embodiment in the arrangement of regions in the semiconductor thin film 7. The other structure of the photosensor S4 is the same as that of the photosensor S1. Specifically, the semiconductor thin film 7 has a p region, which is a first conductivity type doped region, as a light receiving portion 7p'. Second conductivity type doped regions, i.e., n regions 7n' are arranged so as to sandwich the light receiving portion (p region) 7p'. The photosensor S4 is designed as a MOS sensor. In the following description, detailed explanation of the same components as those in the first embodiment is omitted.

The substrate 1, made of a transparent material, has the recess 1a that has the inclined side wall A having such a forward tapered shape that the width of the recess is gradually increased toward the open end of the recess. The reflective material layer 3 patterned so as to cover the inner wall, including the bottom and the inclined side wall A, and the periphery of the recess 1a may be disposed as, for example, a gate electrode.

As for the insulating layer 5, made of a light-transmissive material, covering the substrate 1 having thereon the reflective material layer 3, the layer 5 also functions as a gate insulating layer in the case where the reflective material layer 3 is disposed as a gate electrode.

The semiconductor thin film 7 on the insulating layer 5 includes the light receiving portion (p region) 7p' above the recess 1a. In the semiconductor thin film 7, it is preferred that the light receiving portion (p region) 7p' be completely covered with the reflective material layer 3 and be positioned above the bottom of the recess 1a covered with the reflective material layer 3.

More preferably, a portion W where the n region (S) 7n', which is one of the two n regions on both the sides of the light receiving portion (p region) 7p' and is used as a source region, overlaps the reflective material layer 3 has a sufficient width (overlap width W) such that the reflective material layer 3 completely covers the PN junction surface as the interface between the light receiving portion (p region) 7p' and the n region (S) 7n'. The n region (S) 7n, which is one of the two n regions 7n' sandwiching the light receiving portion (p region) 7p' and is used as the source region, may be connected to the gate electrode including the reflective material layer 3 through the interconnect 11.

In the photosensor S4 with the above-described structure, since the reflective material layer 3 is disposed on the bottom and the inclined side wall A of the recess 1a of the substrate 1, the sensitivity to received light can be improved by converging light, coming from the side of the display surface toward the photosensor S4, to the light receiving portion (p region) 7p'.

In the fourth embodiment, the bottom-gate MOS-TFT photosensor S4 in which the reflective material layer 3 is used as the gate electrode has been described. The present application can be applied to a top-gate MOS-TFT photosensor. In this case, a gate electrode made of a transparent conductive material may be arranged over the light receiving portion (p region) 7p' of the semiconductor thin film 7, with the insulating interlayer 9 as a gate insulating layer therebetween.

Consequently, the following effects can be obtained: The first effect is obtained by reflecting light, coming from above the substrate 1, impinged on the semiconductor thin film 7 by the reflective material layer 3 and allowing the reflected light to again enter the light receiving portion (p region) 7p' of the semiconductor thin film 7. The second effect of preventing light, directly coming from the rear of the substrate 1, from entering the light receiving portion (p region) 7p' of the semiconductor thin film 7 can be obtained by blocking out the light through the reflective material layer 3.

The fourth embodiment has been described with respect to the n-channel MOS-TFT photosensor in which p region 7p' as the first conductivity type doped region is used as the light receiving portion and the n regions 7n', as the second conductivity type doped regions, sandwich the light receiving portion (p region) 7p'. The present application can also be applied to a p-channel MOS-TFT photosensor in which the first conductivity type is n type and the second conductivity type is p type. In this case, the same advantages as those of the fourth embodiment can be obtained.

Combining the MOS photosensor including the above-described reflective material layer with that according to the second embodiment can obtain the same advantages. Since the sensitivity to long-wavelength light is improved, infrared light that is invisible can also be sensed.

Structure of Display Device

The structure of a display device, including any of the above-described photosensors S, according to an embodiment will be described below. First, the entire structure of the display device will now be described with reference to a block diagram of FIG. 6.

Figure 6:
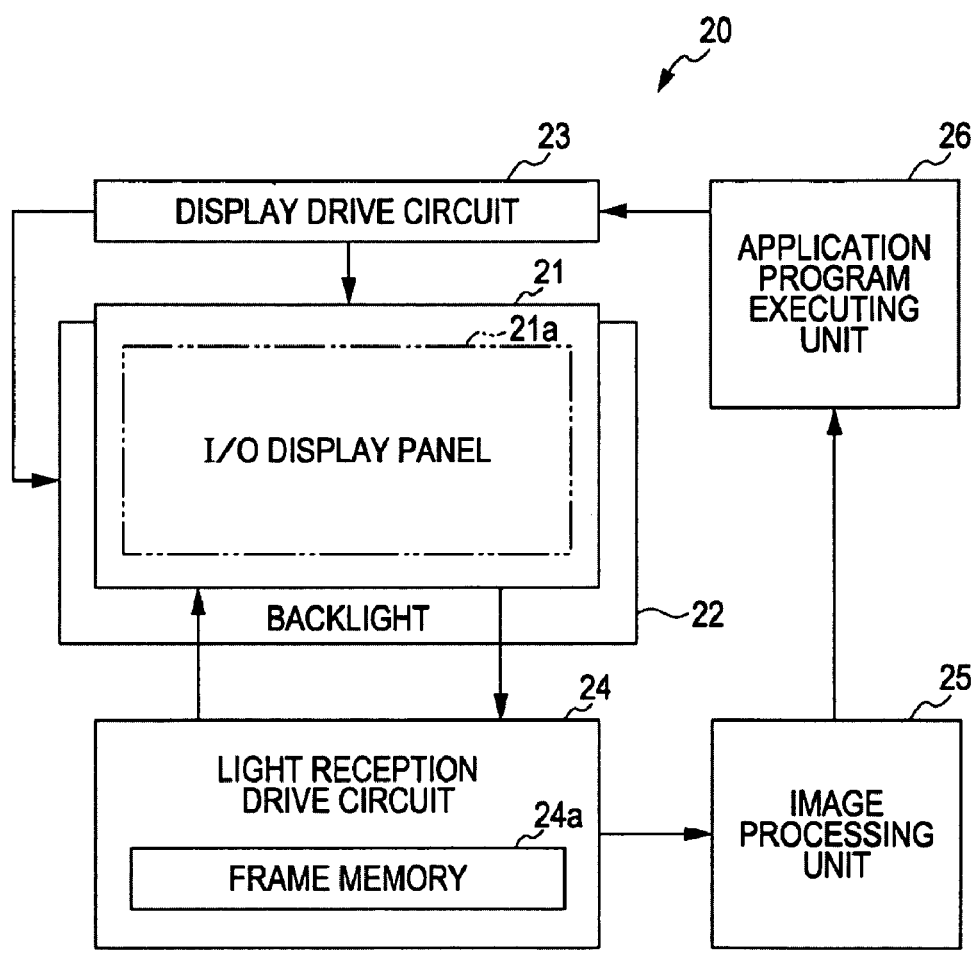
FIG. 6 is a diagram illustrating the entire structure of a display device according to another embodiment.

Referring to FIG. 6, the display device, indicated at 20, includes a display panel 21, a backlight 22, a display drive circuit 23, a light reception drive circuit 24, an image processing unit 25, and an application program executing unit 26.

The display panel 21 includes a liquid crystal display (LCD) panel in which a plurality of pixels are arranged in a matrix in a central display area 21a and has a function (display function) of displaying a predetermined graphic or text image based on display data while performing line-sequential operation. As will be described below, the display area 21a has a sensor function (imaging function) of sensing an object that is in contact with or close to the display surface of the display panel 21.

The backlight 22, serving as a light source for the display panel 21, includes, for example, a plurality of light emitting diodes arranged in-plane. The light emitting diodes that emit visible light and invisible light, such as ultraviolet light and infrared light, are used. Alternatively, light emitting diodes that emit visible light and those that emit invisible light are used in combination. Accordingly, the backlight 22 has a mechanism for emitting visible light and invisible light.

The display drive circuit 23 drives the display panel 21 to perform the line-sequential operation so that the display panel 21 displays (i.e., performs the operation of displaying) an image based on display data.

The light reception drive circuit 24 drives the display panel 21 to perform the line-sequential operation so that the display panel 21 obtains light reception data for imaging, for example, an object. Light reception data acquired by the respective pixels is stored into a frame memory 24a in, for example, frame units and is output as a captured image to the image processing unit 25.

The image processing unit 25 performs predetermined image processing (arithmetic processing) based on a captured image output from the light reception drive circuit 24, detects information concerning an object in contact with or close to the display panel 21, and acquires the information, the information being position coordinate data or data about the shape or size of the object.

The application program executing unit 26 executes a process according to predetermined application software on the basis of the result of detection by the image processing unit 25. For example, the application program executing unit 26 executes a process of generating display data such that the data contains the position coordinates of a detected object and displaying an image based on the display data on the display panel 21. Display data generated by the application program executing unit 26 is supplied to the display drive circuit 23.

Circuit Configuration of Display Area

Figure 7:
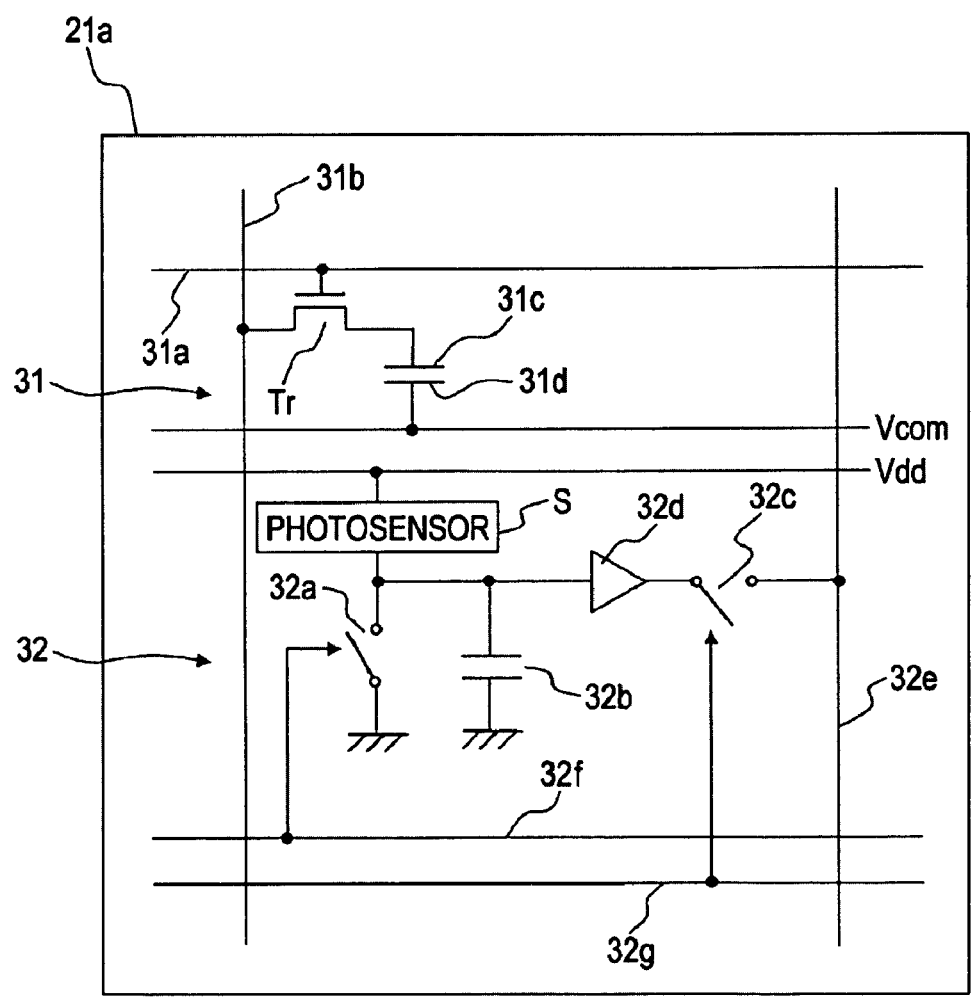
FIG. 7 is a diagram illustrating the circuit configuration in a display area of the display device.

FIG. 7 is a diagram illustrating the circuit configuration in the display area 21a of the display device 20.

Referring to FIG. 7, the display area 21a includes a plurality of pixel portions 31 and a plurality of sensor portions 32.

The pixel portions 31 are arranged near the respective intersections of a plurality of scanning lines 3 1a extending in the horizontal direction and a plurality of signal lines 31b extending in the vertical direction. Each pixel portion 31 includes a thin film transistor (TFT) Tr serving as, for example, a switching element.

The gate of each thin film transistor Tr is connected to the scanning line 31a, one of the source and drain thereof is connected to the signal line 31b, and the other one of them is connected to a pixel electrode 31c. The pixel portions 31 include a common electrode 31d for supplying a common potential Vcom to the respective pixel portions 31. Those pixel electrodes 31c and the common electrode 31d sandwich a liquid crystal layer therebetween.

Each thin film transistor Tr is turned on or off in accordance with a drive signal supplied through the corresponding scanning line 31a. The thin film transistor Tr has a structure in which during the ON state, a pixel voltage is applied to the pixel electrode 31c on the basis of a display signal supplied from the corresponding signal line 31b and the liquid crystal layer is driven by the electric field between the pixel electrode 31c and the common electrode 31d.

The sensor portions 32 are arranged in predetermined positions in the display area 21a. The sensor portions 32 may be arranged for the respective pixel portions 31. Each sensor portion 32 includes the photosensor S (S1, S2, S3, or S4) having the structure according to any of the first to fourth embodiments.

Each photosensor S is supplied with a power supply voltage Vdd. The photosensor S is connected to a reset switch 32a and a capacitor 32b. While the photosensor S is reset by the reset switch 32a, charge corresponding to the amount of light received is stored by the capacitor 32b. The stored charge is supplied to a signal output electrode 32e through a buffer amplifier 32d at the time when a read switch 32c is turned on and is then output to the outside of the photosensor S. Turning on or off of the reset switch 32a is controlled in accordance with a signal supplied through a reset electrode 32f. Turning on or off of the read switch 32c is controlled in accordance with a signal supplied through a read control electrode 32g.

Structure of Display Panel

Figure 8:
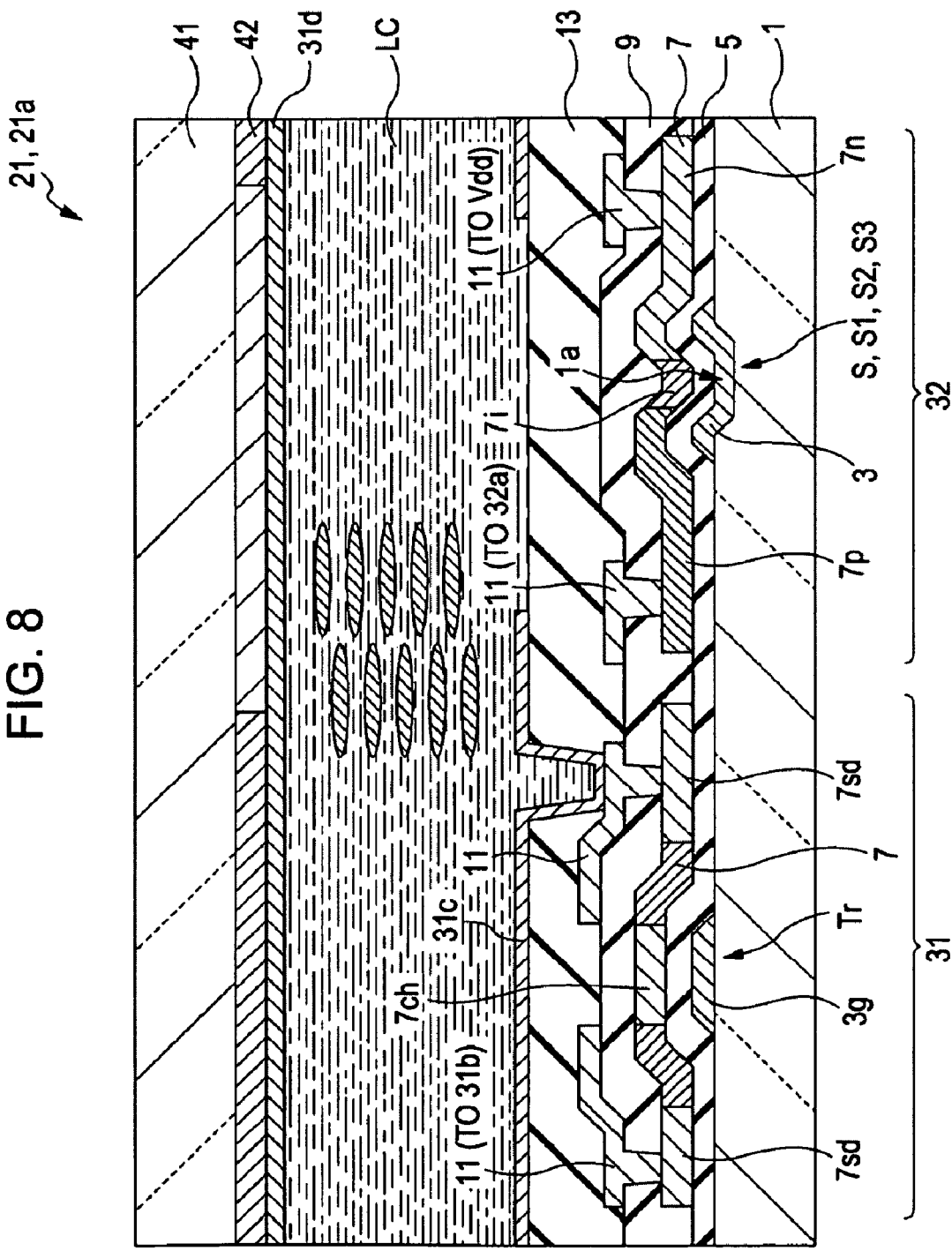
FIG. 8 is a schematic cross-sectional view of the structure of a display panel in the display area.

FIG. 8 is a schematic cross-sectional view of the display area 21a of the display panel 21 and explains the structure of the thin film transistor Tr disposed in each pixel portion 31 and the structure of the photosensor S arranged in each sensor portion 32. The same components as those previously described with reference to the above-described drawings are designated by the same reference numerals.

Referring to FIG. 8, the bottom-gate thin film transistor Tr, functioning as a pixel-drive switching element, is disposed in the pixel portion 31. The photosensor S (S1, S2, S3, or S4) with the structure described in any of the foregoing first to fourth embodiments and the capacitor 32b (not shown) are disposed in the sensor portion 32. As the typical photosensor S disposed in the sensor portion 32, any of the photosensors S1, S2, and S3 each including a PIN diode is shown in FIG. 8. The MOS photosensor S4 described in the fourth embodiment may be arranged in the sensor portion 32.

Characteristically, the thin film transistor Tr and the photosensor S on the substrate include the semiconductor thin film 7, including polysilicon or oxide semiconductor, formed in the same step and have the following structures.

Specifically, the thin film transistor Tr includes the substrate 1, made of a light-transmissive material, as a first substrate, a gate electrode 3g on the first substrate 1, the gate electrode 3g including the same layer as the reflective material layer 3 of the photosensor S, and the gate insulating layer 5 covering the first substrate 1 having thereon the gate electrode 3g. The semiconductor thin film 7 including the same layer as the semiconductor thin film 7 of the photosensor S is patterned on the insulating layer 5 such that the semiconductor thin film 7 is disposed over the gate electrode 3g. The semiconductor thin film 7 has doped source/drain electrodes 7sd such that the source/drain regions 7sd are positioned on both sides of the gate electrode 3g. Part of the semiconductor thin film 7 overlapped with the gate electrode 3g is used as an active layer 7ch in which a channel is formed. The active layer 7ch and each of the source/drain regions 7sd sandwich a lightly doped drain (LDD) region.

On the other hand, the photosensor S includes the first substrate 1 having the recess 1a, the reflective material layer 3, and the semiconductor thin film 7 such that the light receiving portion (i region) 7i is disposed over the reflective material layer 3 arranged along the inner wall of the recess 1a as described above in the embodiments.

In the thin film transistor Tr and the photosensor S with the above-described structures, the gate electrode 3g of the thin film transistor Tr and the reflective material layer 3 of the photosensor S include the same layer and the semiconductor thin film 7 of the thin film transistor Tr and that of the photosensor S include the same layer formed in the same step. In a peripheral area adjacent to the display area 21a on the first substrate 1, CMOS drive circuits including p-channel and n-channel thin film transistors Tr are arranged in the same layers as those of the thin film transistors Tr in the display area 21a. In the step of introducing impurities for formation of the source/drain regions 7sd of those transistors, the p region 7p, serving as a p-type diffusion layer, and the n region 7n, serving as an n-type diffusion layer 7n, of the photosensor S are formed.

In addition, the insulating interlayer 9 made of a light-transmissive material, is arranged so as to cover the thin film transistor Tr and the photosensor S which have the above-described structures. The insulating interlayer 9 is overlaid with the interconnects 11 respectively connected to the source/drain regions 7sd of the thin film transistor Tr, and the p region 7p and the n region 7n of the photosensor S. The circuit shown in FIG. 7 includes interconnects including the same layers as conductive layers, such as the reflective material layer 3, the gate electrode 3g, the semiconductor thin film 7, and the interconnects 11. For example, one interconnect 11 connected to the thin film transistor Tr is connected to the signal line 31b. One interconnect 11 connected to the photosensor S is connected to the power supply Vdd and the other interconnect 11 is connected to the reset switch 32a and the capacitor 32b.

In addition, a planarizing insulating layer 13 is disposed so as to cover the interconnects 11. The pixel electrode 31c is disposed on the planarizing insulating layer 13. The pixel electrode 31c, which is made of a transparent conductive material, is connected to the interconnect 11 leading from the source/drain region 7sd of the thin film transistor Tr through a contact hole arranged in the planarizing insulating layer 13.

Furthermore, an alignment layer (not shown) is disposed so as to cover the pixel electrode 31c. The above-described components are arranged on the first substrate 1.

A second substrate 41 is arranged so as to face the pixel electrode 31c on the first substrate 1. The second substrate 41 is made of a light-transmissive material. One surface, facing the pixel electrode 31c, of the second substrate 41 is covered with a color filter layer 42 in which filters of different colors are patterned in each pixel as necessary. In addition, the common electrode 31d made of a transparent conductive material and an alignment layer (not shown) are arranged so as to cover the color filter layer 42. The alignment layers on the two substrates 1 and 41 sandwich spacers (not shown) and a liquid crystal layer LC therebetween.

In addition, the outer surfaces of the respective substrates 1 and 41 are covered with polarizers (not shown), respectively, thus constructing the display panel 21.

In the display device 20 with the above-described structure, since the photosensor S having the above-described structure and the improved sensitivity is used as a photosensor, the photosensors S in the display area 21a can be miniaturized.

Consequently, the occupied area of each sensor portion 32 where the photosensor S is arranged can be reduced, so that the pixel portion 31 can be increased in size, thus increasing the pixel aperture ratio. Advantageously, high-definition image quality of the display device 20 with the sensor function (imaging function) can be achieved.

In particular, since the display device 20 includes the photosensors S having the improved sensitivity to light coming from above the first substrate 1 realized by blocking out light from the rear of the substrate 1 through the reflective material layer 3, the display device 20 can exert the sensor function providing excellent sensitivity without being influenced by noise components from the backlight.

As another display device including the photosensors S having the above-described structure, the display device may have such a structure that sensor portions each including the photosensor S are arranged around the display area 21a and have a function of controlling a backlight in accordance with the intensity of external light sensed by the photosensor S.

The above embodiments have been described with respect to the liquid crystal display device as an example of the display device having the sensor function (imaging function). The embodiments are not limited to the example liquid crystal display device and is applied to any display device in which photosensors are arranged in a display area. The use of the photosensor S with the above-described structure according to any of the embodiments allows for obtaining the same advantages. The present application is applicable to a display device with no backlight.

The above embodiments have been described with respect to the display device in which the respective layers of each photosensor S include the same layers as those constituting the thin film transistors in the pixel portions and the peripheral area. A display device may include any of the photosensors S1 to S4 described in the foregoing embodiments. The same advantages can be obtained.

Applications

The display device according to the above-described embodiment may be applied to display devices of various electronic apparatuses for various fields shown in FIGS. 9 to 13G, e.g., a digital camera, a notebook-sized personal computer, a portable terminal such as a mobile phone, and a video camera. Such a display device displays a video signal supplied to or generated in an electronic apparatus as an image or video. Examples of electronic apparatuses to which the present application is applied will now be described.

Figure 9:
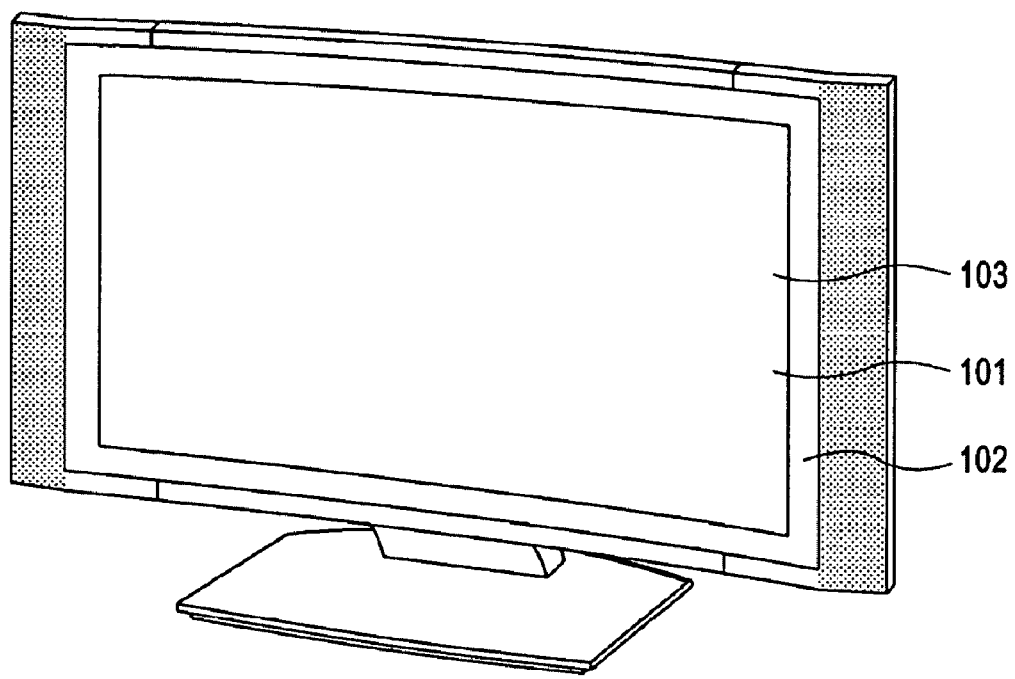
FIG. 9 is a perspective view of a television according to an application.

FIG. 9 is a perspective view of a television according to one application. The television according to this application includes a video display screen unit 101 including a front panel 102 and a filter glass 103. The video display screen unit 101 includes the display device according to any of the embodiments of the present application.

Figure 10A:
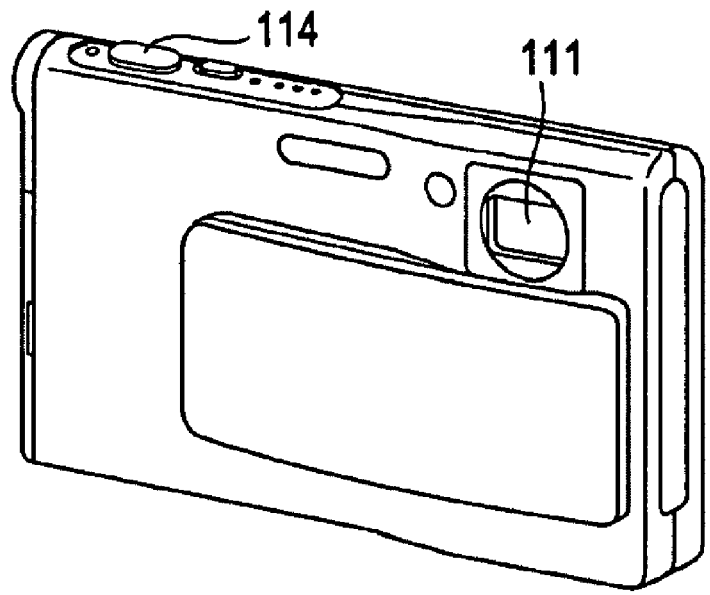
FIGS. 10A and 10B are perspective views of a digital camera according to another application, FIG. 10A being a front perspective view thereof, FIG. 10B being a rear perspective view thereof.
Figure 10B:
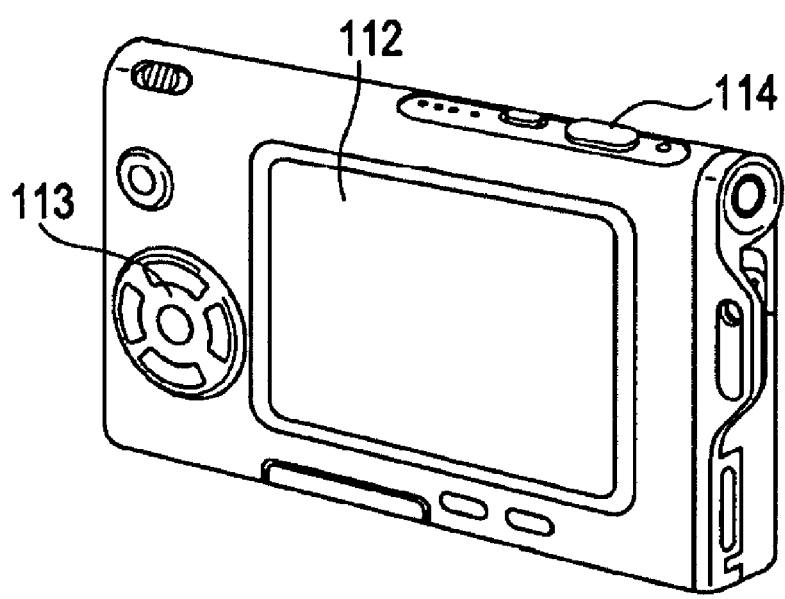

FIGS. 10A and 10B illustrate a digital camera according to another application. FIG. 10A is a front perspective view of the digital camera. FIG. 10B is a rear perspective view thereof. The digital camera according to this application includes a flash light emitting unit 111, a display unit 112, a menu switch 113, and a shutter release 114. The display unit 112 includes the display device according to any of the embodiments of the present application.

Figure 11:
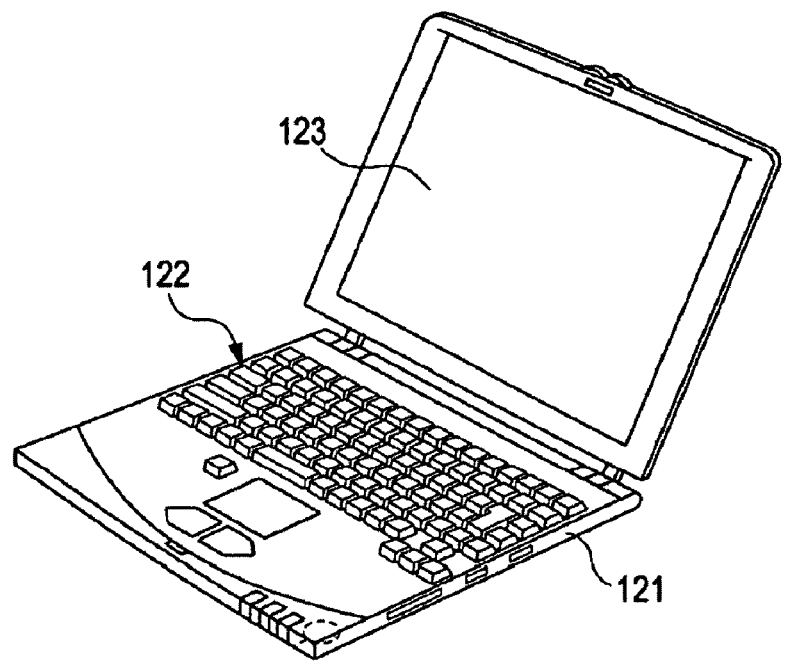
FIG. 11 is a perspective view of a notebook-sized personal computer according to another application.

FIG. 11 is a perspective view of a notebook-sized personal computer according to another application. The notebook-sized personal computer according to this application includes a main body 121, a keyboard 122 which is operated to enter a character, and a display unit 123 for displaying an image. The display unit 123 includes the display device according to any of the embodiments.

Figure 12:
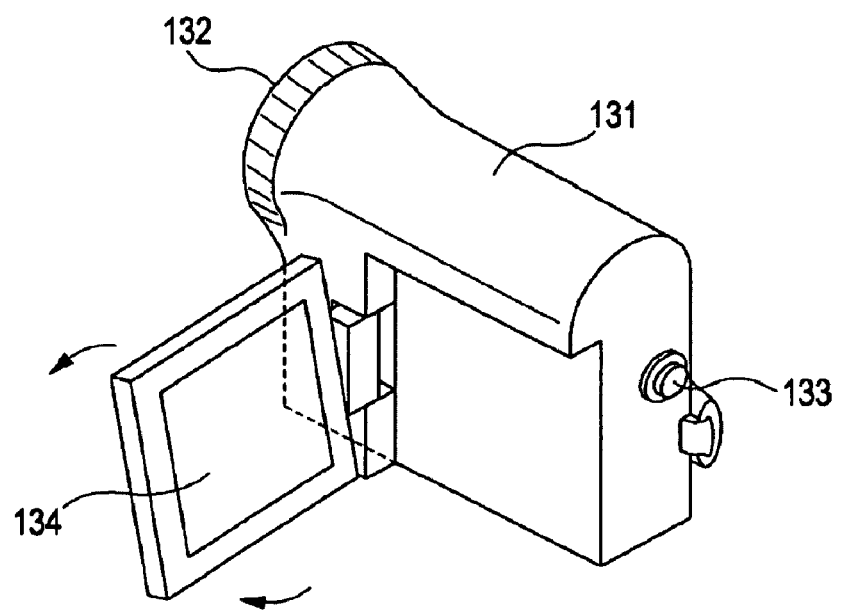
FIG. 12 is a perspective view of a video camera according to another application.
Figure 14:
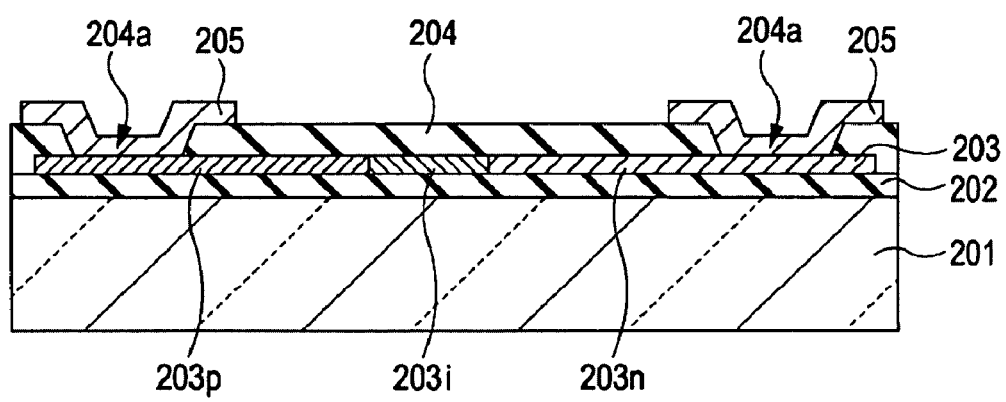
FIG. 14 is a cross-sectional view of a related-art photosensor including a PIN diode.

FIG. 12 is a perspective view of a video camera according to another application. The video camera according to this application includes a main body 131, a subject shooting lens 132 facing forward, a start/stop switch 133 for shooting, and a display unit 134. The display unit 134 includes the display device according to any of the embodiments.

FIGS. 13A to 13G illustrate a portable terminal, such as a mobile phone, according to another application. FIG. 13A is a front view of the mobile phone in an unfolded state, FIG. 13B is a side view thereof in this state, FIG. 13C is a front view thereof in a folded state, FIG. 13D is a left side view thereof in this state, FIG. 13E is a right side view thereof in this state, FIG. 13F is a top view thereof in this state, and FIG. 13G is a bottom view thereof in this state. The mobile phone according to this application includes an upper housing 141, a lower housing 142, a connecting member (a hinge in this case) 143, a main display 144, a sub-display 145, a picture light 146, and a camera 147. The main display 144 and the sub-display 145 each include the display device according to any of the embodiments.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A photosensor including a semiconductor thin film having a light receiving portion, the photosensor comprising:
    a substrate having a recess with an inclined side wall having a forward tapered shape;

a reflective material layer disposed along the recess of the substrate;

an insulating layer covering the substrate having thereon the reflective material layer; and the semiconductor thin film disposed on the insulating layer so as to cross the recess, wherein the light receiving portion of the semiconductor thin film is disposed above the recess.

2. The photosensor according to claim 1, wherein the semiconductor thin film includes an i-doped region, used as the light receiving portion, a p-doped region, and an n-doped region such that the p-doped and n-doped regions sandwich the i-doped region.

3. The photosensor according to claim 2, wherein the reflective material layer is connected to one of the p-doped region and the n-doped region.

4. The photosensor according to claim 3, further comprising:

a light-transmissive insulating interlayer covering the semiconductor thin film; and an interconnect disposed on the insulating interlayer, the interconnect being connected to the p-doped region or the n-doped region via a contact hole arranged in the insulating interlayer, wherein the reflective material layer is connected to one of the p-doped region and the n-doped region through the interconnect.

5. The photosensor according to claim 1, wherein the semiconductor thin film has a first conductivity type doped region, used as the light receiving portion, and two second conductivity type doped regions such that the second conductivity type doped regions sandwich the light receiving portion, and the reflective material layer is used as a gate electrode.

6. The photosensor according to claim 1, wherein the i-doped region senses visible light and invisible light.

7. A display device including a substrate, a pixel portion, and a photosensor such that the pixel portion and the photosensor are disposed on one surface of the substrate, the photosensor comprising:

a reflective material layer disposed along a recess arranged in the substrate, the recess having an inclined side wall with a forward tapered shape;

an insulating layer covering the substrate having thereon the reflective material layer; and a semiconductor thin film disposed on the insulating layer so as to cross the recess, wherein a light receiving portion of the semiconductor thin film is disposed above the recess.

8. The display device according to claim 7, wherein the pixel portion has a thin film transistor for pixel driving, the semiconductor thin film constituting the photosensor includes the same layer as a semiconductor thin film constituting an active layer of the thin film transistor, and the reflective material layer includes the same layer as a gate electrode of the thin film transistor.

9. The display device according to claim 7, further comprising:

an opposite substrate arranged so as to face the photosensor disposed on the surface of the substrate; and a liquid crystal layer arranged between the substrate and the opposite substrate.

10. The display device according to claim 9, further comprising:

a backlight disposed on the other surface of the substrate.

11. The display device according to claim 10, wherein the backlight emits visible light and invisible light.

* * * * *